United States Patent
Baklanov

(10) Patent No.: US 8,961,803 B1
(45) Date of Patent: Feb. 24, 2015

(54) PROTECTION OF POROUS SUBSTRATES BEFORE TREATMENT

(71) Applicant: Imec VZW, Leuven (BE)

(72) Inventor: Mikhaïl Baklanov, Veltem-Beisem (BE)

(73) Assignee: Imec VZW, Leuven (BE)

( * ) Notice: Subject to any disclaimer, the term of this patent is extended or adjusted under 35 U.S.C. 154(b) by 0 days.

(21) Appl. No.: 14/327,449

(22) Filed: Jul. 9, 2014

(30) Foreign Application Priority Data

Sep. 17, 2013 (EP) .................................... 13184718

(51) Int. Cl.
- *B31D 3/00* (2006.01)
- *H01L 21/02* (2006.01)
- *H01L 21/3065* (2006.01)
- *H01L 21/308* (2006.01)

(52) U.S. Cl.
CPC ...... *H01L 21/02203* (2013.01); *H01L 21/3065* (2013.01); *H01L 21/3086* (2013.01); *H01L 21/02164* (2013.01)
USPC ............................................ 216/56; 216/67

(58) Field of Classification Search
USPC ..................................................... 216/56, 67
See application file for complete search history.

(56) References Cited

U.S. PATENT DOCUMENTS

| 8,540,890 B2 * | 9/2013 | Baklanov et al. ............... 216/56 |
| 2005/0148202 A1 | 7/2005 | Heiliger et al. |

FOREIGN PATENT DOCUMENTS

EP 2 595 182 A1 5/2013

OTHER PUBLICATIONS

Frot et al. "Application of the Protection/Deprotection Strategy to the Science of Porous Materials" Adv. Mater. 2011, 23, 2828-2832.
Zhang et al. "Low Damage Cryogenic Etching of Porous Organosilicate Low-k Materials Using $SF_6/O_2/SiF_4$," ECS Journal of Solid State Science and Technology, 2 (6) N131-N139 (2013).

* cited by examiner

*Primary Examiner* — Roberts Culbert
(74) *Attorney, Agent, or Firm* — Knobbe Martens Olson & Bear LLP

(57) ABSTRACT

A method is provided for treating a surface of a porous material in an environment, the method comprising the steps of contacting a porous material with an organic gas in an environment having a pressure P1 and a temperature T1, wherein the organic gas is such that at the pressure P1 and at the temperature T1 it remains a gas when outside of the porous material but condenses as an organic liquid when in contact with the porous material, thereby filling pores of the porous material with the organic liquid, cooling down the filled porous material to a temperature T2 such that the organic liquid freezes within the pores, thereby sealing the pores with an organic solid, thereby providing a protected porous material, and performing a treatment on the surface.

18 Claims, 7 Drawing Sheets

PROTECTION OF POROUS SUBSTRATES BEFORE TREATMENT

CROSS-REFERENCE TO RELATED APPLICATION

Any and all priority claims identified in the Application Data Sheet, or any correction thereto, are hereby incorporated by reference under 37 CFR 1.57. This application claims the benefit of European Application No. EP 13184718.8 filed Sep. 17, 2013. The aforementioned application is incorporated by reference herein in its entirety, and is hereby expressly made a part of this specification.

TECHNICAL FIELD OF THE INVENTION

A method is provided for protecting porous materials against damages upon etching or modification of a surface thereof. In particular, the method relates to the field of semiconductor devices and to the protecting of low-k dielectrics against plasma induced damages.

BACKGROUND OF THE INVENTION

When a porous substrate needs to be treated by etching or modification of a surface thereof, damage of the substrate often occurs. This is particularly true with plasma mediated treatments. This is presumably caused by active plasma radicals penetrating deeply into the porous substrate and reacting therewith, thereby changing its composition and its porosity. Both oxidative and reductive plasmas have such detrimental effects. These problems for instance occur in the field of microelectronics during integration of low-k dielectrics.

Low-k dielectrics (materials having a dielectric constant lower than the dielectric constant of $SiO_2$, i.e. lower than 4.0) are necessary to decrease capacitance between nearby conductive portions of high density integrated circuits and thereby avoiding loss of speed and cross-talk. In order to decrease the dielectric constant of low-k dielectrics as much as possible, low-k dielectrics are made porous. Thereby, the dielectric constant can be lowered down to about 2.0 or even less. Integrated circuit fabrication processes on dielectrics involve plasma etching and expose therefore the dielectrics to the damages mentioned above.

US2005/0148202 describes a method for sealing or protecting porous materials used in semiconductor fabrication. It describes sealing the pores of a porous material by applying a mixture of a polymer compound and an organic solvent. The sealing layer thus formed is further dried resulting in evaporation of organic solvents and volatile constituents (if any), and securing of the polymer compound on the surface as a sealing material. Such a sealing method has however several drawbacks. The long contact time between a hot solvent and the substrate makes dissolution or damage of the substrate possible.

Furthermore, the method is rather complicated, tedious and labour-intensive since it involves synthesising a particular polymer having well defined end-groups, preparing a particular polymer solution, applying it homogeneously on the substrate (this implies good wettability and elaborated application techniques), and heating the solution to evaporate solvent and/or dry the polymer. Furthermore, polymer deposition typically generates stresses in porous substrates. Also, the polymer being retained in the pores in the final product, it potentially influences the properties of the dielectrics making them harder to control. It also raises the question of mechanical stability when there is a mismatch between the thermal coefficient expansion of the polymer and of the porous material. Last but not least, polymers tend to have difficulties completely filling pores and/or entering the smallest pores, resulting in a filling which is not optimally dense (see FIG. 7 (P)).

Dubois et al (Adv. Mater. 2011, 23, 25, 2828-2832) discloses a similar method for sealing porous low-k dielectrics with an organic polymer. The polymer is degraded by thermal treatment once the etching and other processing steps are performed. This presumably permits the patterned dielectric in the final structure to have comparable properties to its pristine equivalent. However, removing a polymer by thermal means implies degrading it and thereby the possibility of leaving polymer residues in the pores. Also, it is energy intensive. Furthermore, the other drawbacks proper to the use of polymers remain as mentioned above for US2005/0148202.

EP2595182 discloses a method for treating a surface of a porous material in an environment, the method comprising the steps of setting the temperature of the surface to a value T2 and setting the pressure of the environment to a value P1, contacting the surface with a fluid having a solidifying temperature at the pressure value P1 above the value T2 and having a vaporizing temperature at the pressure value P1 below 80° C., thereby solidifying the fluid in pores of the material, thereby sealing the pores, treating the surface, wherein the treatment is preferably an etching or a modification of the surface, and setting the temperature of the surface to a value T3 and setting the pressure of the environment to a value P2 in such a way as to vaporize the fluid.

Although this method is effective at preventing much damage to porous substrates, some damages still occurs.

SUMMARY OF THE INVENTION

There is therefore a need in the art for a way to prevent damage to porous substrates upon treatment of the substrate (e.g., via etching or surface modification), which avoids the above drawbacks.

An object of the embodiments is to provide a method which permits the treatment of a porous material surface while protecting it from excessive damages.

It is an advantage of embodiments that it may ease the cleaning of the porous material after the treatment.

It is an advantage of embodiments that a particularly good protection of the porous material can be obtained.

It is an advantage of embodiments that pores of very small dimensions (e.g., micropores) can be filled and protected.

It is an advantage of embodiments that plasma-induced fluorine diffusion within the porous material may be avoided or limited.

It is an advantage of embodiments that the method may protect the porous material against vacuum ultraviolet (VUV) induced damage.

It is an advantage of embodiments that it may allow treatments (such as, e.g., plasma treatment) at non-cryogenic temperature (e.g., at −50° C. or above), thereby reducing costs.

It is an advantage of embodiments that it may involve a moderate deprotecting temperature after the treatment, thereby reducing costs and increasing compatibility with temperature sensitive substrates.

It is an advantage of embodiments that it is an organic gas that is used for contacting a porous material, thereby permitting the contacting to occur in a vacuum chamber wherein the porous substrate is easily delivered and wherein plasma etch can be performed.

The above objectives are accomplished and advantages achieved by a method as provided.

In a first aspect, a method is provided for treating a surface of a porous material in an environment, the method comprising the steps of: contacting a porous material with an organic gas in an environment having a pressure P1 and a temperature T1, wherein the organic gas is such that at the pressure P1 and at the temperature T1 it remains a gas when outside of the porous material but condenses as an organic liquid when in contact with the porous material, thereby filling pores of the porous material with the organic liquid, cooling down the filled porous material to a temperature T2 such that the organic liquid freezes within the pores, thereby sealing the pores with an organic solid, and performing a treatment on the surface.

This method permits a particularly efficient filling of the pores (e.g., including micropores), since the organic gas diffuses easily within the porous material (even in the micropores), then liquefies upon contact with the porous material and diffuses still to some extent by capillarity. This permits a filling of pores that compares favorably to a direct capillary filling by a liquid (which enters micropores with more difficulty) or to a filling with a gas that freezes upon contact with the porous material.

In a second aspect, a device is provided comprising a treated porous material obtainable by a method according to any embodiment.

Particular and preferred aspects are set out in the accompanying independent and dependent claims. Features from the dependent claims may be combined with features of the independent claims and with features of other dependent claims as appropriate and not merely as explicitly set out in the claims.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 1:
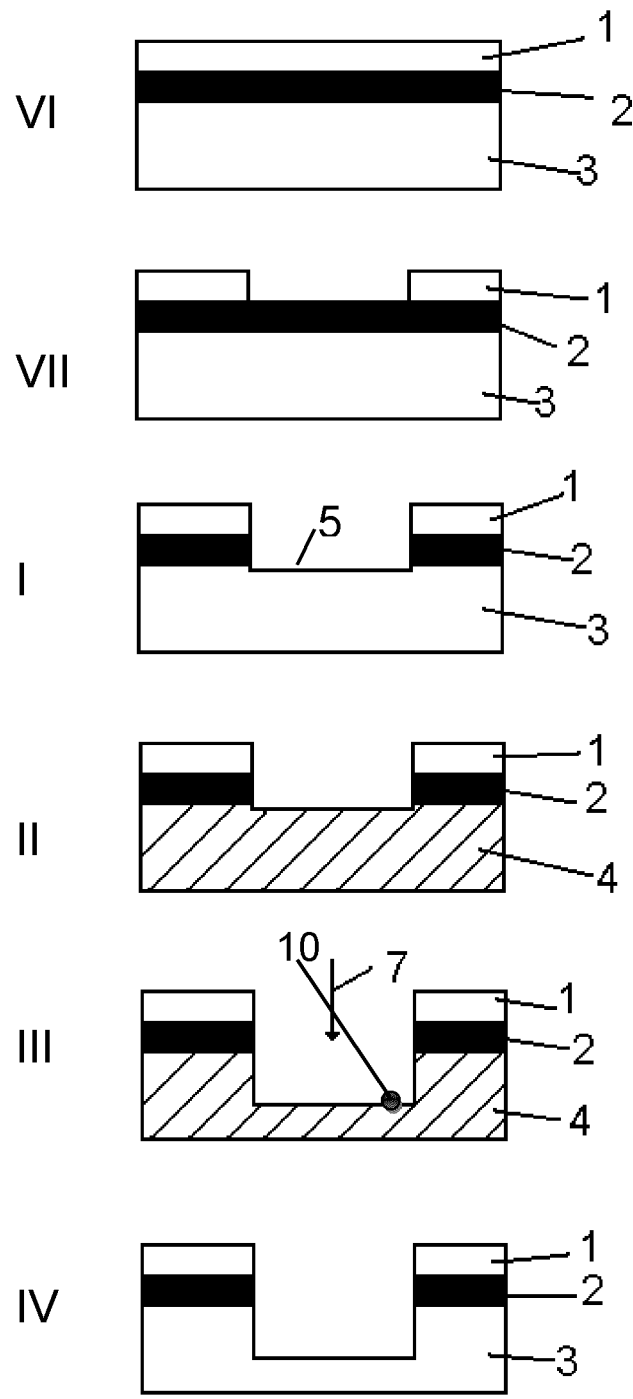
FIG. 1 is a diagrammatic illustration of a process according to an embodiment wherein the pores of a porous substrate are filled and thereby sealed before treating (etching) the surface of the porous substrate.

In the different figures, the same reference signs refer to the same or analogous elements.

DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms "first", "second", "third" and the like, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms "top", "bottom", "over", "under" and the like are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where a range of values is provided, it is understood that the upper and lower limit, and each intervening value between the upper and lower limit of the range is encompassed within the embodiments.

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

All references cited herein are incorporated herein by reference in their entirety. To the extent publications and patents or patent applications incorporated by reference contradict the disclosure contained in the specification, the specification is intended to supersede and/or take precedence over any such contradictory material.

In the present description, reference will be made to "organic compounds".

In the context of the embodiments, an organic compound is any compound which contains carbon atoms. This includes organometallic compounds. Some embodiments however exclude organometallic compounds. In the embodiments, organic compounds are the compounds that are contacted in their gas phase with the porous material, wherein they will transition to their liquid phase before being frozen to their solid phase. In function of the specific context, the term organic compound will therefore sometimes be substituted by a more precise term where the phase of the compound is made explicit (organic gas, organic liquid or organic solid). Each of these more specific terms however always refer to a same organic compound and can be substituted by the terms "organic compound in the gas phase", "organic compound in the liquid phase" or "organic compound in the solid phase".

In a first aspect, a method is provided for treating a surface of a porous material in an environment, the method comprising the steps of:
I. Contacting a porous material with an organic gas in an environment having a pressure P1 and a temperature T1, wherein the organic gas is such that at the pressure P1 and at the temperature T1 it remains a gas when outside of the porous material but condenses as an organic liquid when in contact with the porous material, thereby filling pores of the porous material with the organic liquid,
II. Cooling down the porous material to a temperature T2 such that the organic liquid freezes within the pores, thereby sealing the pores with an organic solid, thereby providing a protected porous material, and
III. Performing a treatment on the surface.

In an embodiment, the method may further comprise a step IV after step III of removing the organic solid.

In an embodiment, the removing may comprise contacting the organic solid with an auxiliary liquid miscible with the organic liquid. This is advantageous because if the treated (e.g., etched) sample is contacted with such an auxiliary liquid, the organic solid (e.g., in which waste products may be entrapped or on which waste products may be present) can be dissolved in the auxiliary liquid and the waste can thereby be removed together with the organic solid by a simple washing process. This is especially useful to clean the substrate from metal wastes which are more difficult to remove and more detrimental to the performance of semiconductor devices than other types of wastes. Contacting the substrate with the auxiliary liquid can, for instance, be performed by dipping the substrate in the auxiliary liquid. Optionally, the temperature of the substrate and/or the auxiliary liquid can be raised sufficiently to permit the dissolution of the organic solid in the auxiliary liquid. For instance, the temperature can be raised to a temperature above the melting point of the organic solid at the condition of pressure involved (e.g., atmospheric pressure).

In an alternative embodiment, the removing may comprise raising the temperature of the protected porous material 4 to a value T3 in such a way as to vaporize the organic solid. This embodiment does not require an auxiliary liquid and is more straightforward than the embodiment involving an auxiliary liquid. This embodiment is especially advantageous when the level of waste in the pores or on the surface of the substrate is low or does not include metal wastes.

In an embodiment, the temperature of the porous material may be equal to T1 at the time of the performance of step I. In other embodiments, at the time of the performance of step I, it may be lower than T1 but higher than the melting temperature of the organic liquid.

In an embodiment, step II may be delayed until the porous material and the organic compound are at equilibrium. This typically results in all accessible pores to be entirely filled with the organic liquid. The exact conditions can be selected by using, for instance in situ ellipsometry.

In an embodiment, T3 may be 250° C. or less, preferably from 10 to 40° C.

In an embodiment, T2 may be higher than −130° C., preferably from −50° C. to −10° C.

In an embodiment, T1 may be 250° C. or less, preferably from 10 to 40° C. Most preferably, T1 may be from 18 to 25° C.

In an embodiment, the method may further comprise:
before step I,
VI. Providing a porous material having a surface bearing a resist layer, and
VII. Patterning the resist layer so as to expose a surface of the porous material, thereby providing the surface of the porous material, wherein the treatment of the surface is an etching of the surface, thereby forming a recess in the porous material.

The porous material may be any porous material. The material can, for instance, take the form of a layer supported on a substrate or can be self-supported.

The porous material may, for instance, be a nanoporous material, i.e., a material with pores having on average a diameter of between 0.2 and 1000 nm, or may be a material with pores having on average a diameter equal to or larger than 1 μm. Preferably, the porous material is a nanoporous material.

Nanoporous materials can be subdivided into three categories, the macroporous materials, the mesoporous materials and the microporous materials.

Macroporosity refers to pores greater than or equal to 50 nm and smaller than 1000 nm in diameter.

Mesoporosity refers to pores greater than or equal to 2 nm and smaller than 50 nm in diameter.

Microporosity refers to pores greater than 0.2 nm and smaller than 2 nm in diameter.

The embodiments can be used with nanoporous materials belonging to any of these three categories. However, a family of materials for which the method according to embodiments is particularly useful is mesoporous materials, and in particular mesoporous low-k materials, in particular those with a pore size of between 2 and 10 nm.

These materials have repeatedly been demonstrated to suffer from plasma induced damage, making their etching an ongoing challenge which the embodiments help to meet.

The porous material is preferably a porous low-k material.

In embodiments of the first aspect, the material may have a dielectric constant lower than 3.9, preferably lower than 3.5, more preferably lower than 3.0 and most preferably lower than 2.4. The method according to embodiments is advantageously applied to such low-k materials, in particular prior to plasma treatment (e.g., etching). The use of plasma etching on such low-k materials has been shown to cause damages and waste products and embodiments help to prevent such damages and to clean such waste products.

In embodiments of the first aspect, the porosity of the porous material may be interconnected (at least partly interconnected, preferably fully interconnected). When the porous material is interconnected, the method of the embodiments permits the very efficiently filling of all pores of the surface or material with liquid, thereby assuring that, e.g., during the etching of a cavity in the material, all walls of the cavity are sealed with the solidified liquid.

A material having a fully interconnected porosity is advantageous because an organic compound as defined in any embodiment can fill all pores of a 1 μm thick material film in 2 minutes or less by contacting its top surface (if the top surface is free, i.e., has no hard mask, resist or other layer thereon).

In embodiments, the porous material may have a porosity of 10% or more, preferably 20% or more, more preferably 30% or more and most preferably 40% or more. In embodiments, the porous material may have a porosity of 80% or less. A porosity of 10% means that the pores amounts for 10% of the volume of the porous material. A greater porosity is advantageous as it increases the speed of diffusion of the organic compound in the porous material. It therefore shortens the contacting step of the method and increases its efficiency.

In an embodiment, the thickness of the porous material is 600 nm or less, preferably 400 nm or less, most preferably 300 nm or less. Embodiments permit to fill the pores of a 200 nm layer in only a few seconds.

In embodiments, the material may be a porous silicon-containing material.

Porous silicon-containing materials include for instance porous silica materials (e.g., not containing carbon atoms or containing less than 1% wt. carbon atoms) and porous organosilicate materials (e.g., containing more than 1% wt. carbon atoms). Examples of porous silica materials are silica aerogels, silica xerogels, silsesquioxanes such as hydrisosilsesquioxane (HSQ), silicalite-based films, dendrite-based porous glass and mesoporous silica amongst others.

Examples of porous organosilicates are porous carbon-doped silicon dioxides and silsesquioxanes such as alkylsilsesquioxane (e.g., methylsilsesquioxane (MSSQ)), amongst others. Preferably the porous silicon-containing material is a porous organosilicate glass.

In a preferred embodiment, the porous material (e.g., a low-k material) may be prepared as follow before to perform step I:
- a surface of the porous material is optionally provided with a hard mask (e.g., comprising TaN, TiN, SiN, or amorphous carbon) covering the surface,
- the hard mask (if present) or a surface of the porous material (if no hard mask is present) is provided with a resist covering the hard mask (if present) or the surface of the porous material (if no hard mask is present),
- openings are performed in the resist,
- if a hard mask is present, openings are performed in the hard mask by etching through the openings in the resist. The plasma can for instance be an F (fluor)-containing plasma. In embodiments, the plasma etching can be done at the temperature T2 and pressure P1. The result is a porous material having an exposed surface.

In this preferred embodiment, the treatment of the surface is preferably a plasma etching treatment. FIGS. 1-5 and their corresponding description exemplify such embodiments.

The environment can be any environment but is typically a chamber (e.g., comprising a bearing for the porous material). Preferably it is a chamber in which the temperature can be set below room temperature. Preferably it is a chamber in which the pressure can be set below 1 atm. A cryogenic chamber for plasma treatment is a typical example. Instead of cooling the whole chamber to temperature T2, a bearing within this chamber can be cooled down to the temperature T2.

In embodiments, the porous material may be placed in the environment on a bearing. In the field of semiconductor processing, the bearing is typically a chuck. During step I, the porous material may be placed in thermal contact with the bearing in such a way that the surface faces away from the bearing. During step I, the temperature of the bearing may be set at T1. During step II, the bearing can be cooled down to temperature T2. This is advantageous because controlling the temperature of the bearing is more efficient for controlling the temperature of the porous material surface than controlling the temperature of the entire environment (e.g., a chamber).

In embodiments, the bearing may have retractable pins and the bearing may, for instance, be at temperature T2. This is advantageous as it permits the porous substrate to be 1) placed on the pins in the environment at temperature T1, without cooling it down to T2, 2) contacting a surface of the substrate with the organic gas at T1 and P1 (this permits a good fill by capillarity of the porous material with the organic liquid), and 3) lowering the substrate on the bearing by retracting its pins, thereby establishing a good thermal contact between the bearing at T2 and the substrate and thereby lowering the temperature of the surface to the temperature T2.

In embodiments, the temperature T1 can be set actively or passively. Setting the temperature T1 passively is simply using the temperature of the environment (typically room temperature), without increasing or decreasing it to a target temperature and without performing particular acts to maintain it. Typically, setting the temperature passively will be performed by choosing an environment having the desired temperature. Setting the temperature actively implies increasing or decreasing the temperature of the environment to a target value or value range and maintaining the temperature at this value or within this range.

Both types of setting can be used with the embodiments.

In embodiments of the first aspect, the value T2 may be below 20° C., preferably below 15° C., preferably below 10° C., more preferably below 0° C., still more preferably below −5° C., yet more preferably below −10° C.

There is no theoretical lower limit for T2 but for economic reasons, it is usually not necessary to use T2 temperature lower than −130° C. Preferably, T2 is above −100° C. Preferably T2 is above −50° C.

In an embodiment, the pressure P1 may be lower than the equilibrium vapor pressure of the organic gas at temperature T1 but equal to or preferably higher than the critical pressure Pc at temperature T1, wherein the critical pressure Pc is the pressure at which the liquid phase and the vapor phase of the organic gas are at equilibrium within the porous material.

Without being bound by theory, the critical pressure Pc may relate to the equilibrium vapor pressure $P_0$ of the organic gas via the following expression:

$$\ln\left(\frac{P_c}{P_0}\right) = -\frac{f \cdot \gamma \cdot V_L}{r_K \cdot RT}$$

Wherein f is a proportionality constant equal to cos θ, wherein θ is determined experimentally by measuring the contact angle of the organic liquid on the porous material, wherein γ is the surface tension of the organic liquid, wherein $V_L$ is the molecular volume of the organic liquid, wherein $r_K$ is the average radius of the pores, wherein R is the gas constant, and wherein T is the temperature of the porous material (typically T1).

P1 is typically lower than 1 atm.

The contact between the surface of the porous material and the organic gas is typically operated by introducing the gas directly as such in the environment where the porous material is.

In an embodiment, when the treatment step is an etching step, the contacting step between the surface of the porous material and the organic gas may lead to the gas liquefying at contact with the porous material and diffusing within the porous material down to a depth at least equal to the depth of the recess that will be etched in the material during the etching step. This vertical diffusion is advantageous as it permits the porous material to have its pores filled down to the depth. The contacting of the surface of the porous material and the organic compound also usually leads to lateral diffusion under an optionally present mask (resist or hard mask). This vertical and/or lateral diffusion protects the pores of the recess walls during the entire etching process. This has a clear advantage over simply sealing the surface of the substrate with a coating not penetrating in the porous material. Indeed, the protection conferred by a simple non-penetrating coating does not extend to the walls of the recesses being created.

The solidification of the organic liquid in pores of the material is preferably the result of a process wherein the liquid formed upon contacting the porous material and at least partly filling the pores, solidifies within the pores, thereby sealing the pores.

In embodiments, the organic compound may be a solid at temperature T2 and pressure P1 or may solidify at temperature T2 and pressure P1. The vaporization temperature of the organic liquid is preferably below 250° C., preferably below 200° C., yet more preferably below 150° C., still more preferably below 80° C., and most preferably below 40° C. at the pressure P1 at which the contacting step between the surface and the organic gas is operated. This is advantageous as it permits to vaporize the organic compound after the treatment and therefore restore the porosity of the material with a relatively low energetic budget.

In embodiments of the first aspect, the organic liquid may have a vaporizing point below 250° C. at 1 atm, more preferably below 235° C. at 1 atm, yet more preferably below 220° C. at 1 atm and most preferably below 205° C. at 1 atm.

In an embodiment, the organic compound may have a melting point at P1 lower than 25° C., preferably lower than 15° C., preferably lower than 10° C.

Particularly well suited organic compounds have a melting point at P1 lower than 5° C., more preferably lower than 0° C. and most preferably lower than −5° C. The melting point of these fluids is preferably higher than −130° C., more preferably higher than −100° C. at P1.

In embodiments of the first aspect, the organic compound may have a melting point −50° C. or higher at P1. In an embodiment, the liquid may have a melting point at 1 atm lower than 25° C., preferably lower than 15° C., preferably lower than 10° C.

Particularly well suited liquids have a melting point at 1 atm lower than 200° C., more preferably lower than 100° C. and most preferably lower than 50° C. The melting point of these fluids is preferably higher than −50° C., more preferably higher than −30° C. at 1 atm.

In embodiments of the first aspect, the liquid may have a melting point higher or equal to −50° C. at 1 atm.

In an embodiment, the organic compound may be selected from hydrocarbons, fluorocarbons, hydrofluorocarbons, alcohols, aldehydes, ketones, organosilicon compounds and mixtures thereof.

In an embodiment, the organic compound may be selected from hydrocarbons, fluorocarbons, hydrofluorocarbons, alcohols, aldehydes, ketones, and mixtures thereof.

Suitable hydrocarbons may for instance be $C_{6-12}$ hydrocarbons. These hydrocarbons can be linear, branched or cyclic (e.g., cyclooctane, cyclodecane). These hydrocarbons may be saturated (e.g., nonane, decane) or not (e.g., 1-decene). They are advantageous because they confer some protection against vacuum UV (VUV) during plasma treatment. For this purpose, longer hydrocarbons are better.

Suitable fluorocarbons may for instance be $C_{4-10}$ fluorocarbons (e.g., $C_4F_8$, $C_8F_{18}$). These fluorocarbons can be linear, branched or cyclic. These fluorocarbons may be saturated or not.

Suitable hydrofluorocarbons may for instance be $C_{4-10}$ hydrofluorocarbons. These hydrofluorocarbons can be linear, branched or cyclic. These hydrofluorocarbons may be saturated or not.

Suitable organosilicon compounds are for instance siloxanes such as tetramethylcyclotetrasiloxane. Such compounds may help repairing the porous substrate in addition to protect it from damages.

In an embodiment, the organic compound may be selected from alcohols, aldehydes, ketones and mixtures thereof. Such organic compounds are advantageous for various reasons. First, in their liquid phase, they wet particularly well typical substrates used as low-k dielectrics (e.g., organosilicate glasses). These good wetting properties permit the organic liquid to fill efficiently (e.g., completely) the pores of the porous material, thereby, upon solidification, efficiently (e.g., completely) sealing the pores. Second, such organic liquids help cleaning the treated porous material from waste products generated during the treatment.

Cleaning of a porous surface is not always easy because waste products tend to remain entrapped in the pores. In an embodiment, after the treatment and the resulting generation of waste product at the surface and within the pores below the surface, the vaporization of such organic liquids (alcohols, aldehydes and ketones) may drive the waste products out of the pores toward the surface. Once at the surface, they are more easily removed, e.g., by cleaning with an auxiliary liquid. Alternatively, in another embodiment, instead of vaporizing the organic liquid, the porous surface can be directly contacted with an auxiliary liquid miscible with the organic compound used to fill the pores.

Independently of the cleaning method used, it is noted that alcohol, aldehyde and ketone organic compounds are particularly efficient in cleaning the pores at and directly below the surface. Their affinity for the substrate provides these organic compounds with a good affinity for the waste products generated during the treatment of the substrate surface. This permits the organic compounds to attach to the waste product and to transport the waste products toward the surface either during the vaporization step or the auxiliary liquid contacting step.

In embodiments, the organic compound may be selected from alcohol, aldehydes, ketones having either a single hydroxyl group or carbonyl group and having from 6 to 12 carbon atoms, or two functions selected from hydroxyl and carbonyl functions and having from 2 to 5 carbon atoms.

In embodiments, the alcohol may be selected from monohydric alcohols and diols.

Illustrative examples of suitable alcohols are $C_{6-11}$ linear saturated monohydric alcohols such as but not limited to 1-hexanol, 1-octanol or 1-decanol, $C_{7-11}$ branched saturated monohydric alcohols such as but not limited to 2,2-dimethyl-3-pentanol or 2-decanol, $C_{6-8}$ aromatic monohydric alcohols such as but not limited to benzyl alcohol, $C_{2-5}$ linear diols such as but not limited to ethylene glycol or 1,4-butane diol, $C_{5-6}$ cyclic saturated monohydric alcohols such as but not limited to cyclopentanol or cyclohexanol, and linear or branched unsaturated monohydric alcohols such as but not limited to geraniol.

Illustrative examples of suitable aldehydes are $C_{7-11}$ linear saturated aldehydes such as but not limited to octanal or nonanal, $C_{9-11}$ branched saturated aldehydes, $C_{7-9}$ aromatic aldehydes such as but not limited to benzaldehyde and phenyl acetaldehyde.

Illustrative examples of suitable ketones may have the general formula $R_1COR_2$ wherein $R_1$ and $R_2$ either form a 6 or a 7 member cyclic moiety or are independently selected from phenyl and $C_{1-10}$ alkyl chains. Preferably the total number of carbons in the ketone is from 6 to 12.

Illustrative examples of suitable ketones are cyclohexanone, 4-heptanone, 2-decanone and phenyl propyl ketone.

Alcohols, aldehydes, and ketones having longer alkyl chains have the advantage to confer some protection against VUV.

In embodiments of the first aspect, the treatment may be any treatment susceptible to damage the porous material. In embodiments of the first aspect, the treatment may be any treatment susceptible to damage the porous material and produce waste at the surface of the porous material or within the pores of the porous material.

The treatment of the surface may be an etching of the surface, a modification of the surface, or a combination of both. It can also be an etching or a modification of a structure (e.g., a resist layer) present on the surface.

Although the treatment is operated on the surface, it can also have effects in the bulk of the material. For instance, the etching of the surface may create trenches extending within the bulk.

The etching of the surface can be any kind of etching. For instance it can be an isotropic etching, an anisotropic etching or a combination of both. It can be a chemical etching, a physical etching or a combination of both.

In an embodiment, the modification of the surface may be a coating of the surface. For instance it can comprise creating a layer of a second material on the porous material or it can comprise plasma treating the surface to change its properties. For instance it can involve changing the hydrophilicity of the surface, cleaning the surface or forming functional groups on the surface. For instance, coating a low-k porous material with a metal such as gold is in some cases promoted by the treatment of the low-k porous material substrate with a plasma. This process is, for instance, useful in the preparation of substrates for plasmon resonance measurements.

In a preferred embodiment, the treatment is a plasma treatment such as, for instance, a plasma etching, a plasma surface modification or a plasma enhanced deposition. It is noteworthy that a plasma treatment aimed at a structure present on the surface will also lead to a contact between the plasma and the surface. This is also encompassed as an etching or a modification of the surface.

In embodiments of the first aspect, the treatment may be a plasma treatment, preferably a plasma etching. Embodiments advantageously prevent plasma-induced damage. It is an advantage of embodiments that, due to the diffusion of the organic liquid in the pores, the protection of the pores toward the treatment extends to a certain depth below the surface of the porous material. This permits creation of recesses via etching in the porous material while benefiting from the protective effect of the solidified organic compound during the whole etching process.

In embodiments of the first aspect, the treatment may be an etching of the surface so as to form a recess (e.g., a trench). In embodiments, the method further comprises the steps of:
V. filling at least partially the recess with a metal, wherein step V is performed after step III and before or after step IV. This is advantageous since the sealed pores of the recess walls prevent penetration of the metal in the pores.

In embodiments, optionally no hard mask is used prior to form the recess.

In embodiments of the first aspect, the method of anyone of the above embodiments may further comprises:
before step i,
VI. Providing a porous material having a surface bearing a resist layer, and
VII. Patterning the resist layer so as to expose a surface of the porous material, thereby providing the surface of the porous material, wherein the treatment of the surface is an etching of the surface, thereby forming a recess in the porous material.

In embodiments, the temperature T3 may be 10° C. or higher, preferably 15° C. or higher. In embodiments, T3 may be 250° C. or lower, preferably 200° C. or lower, more preferably 150° C. or lower, yet more preferably 80° C. or lower, still more preferably 40° C. or lower. In embodiments, the value T3 may be in the range 10° C.-250° C., preferably 10° C.-200° C., more preferably 10° C.-150° C., yet more preferably 10° C.-80° C., still more preferably 10° C.-40° C. Preferably, T3 is room temperature, i.e., typically a temperature ranging from 20 to 25° C.

In embodiments, T3 may be at least equal to the vaporization temperature of the fluid at the pressure value P1. In practice, T3 can be somewhat higher than T1, for instance from 5 to 50° C. higher. It is also possible to reduce the pressure of the environment below P1 during step IV. This permits to use lower temperatures T3.

In an embodiment, step I may precede step II, step II may precede step III, and step III may precede step IV.

In a second aspect, a device is provided comprising a treated porous material obtainable by the method according to any embodiment of the first aspect.

In embodiments, the device obtained by the method of the first aspect may comprise trenches in a surface thereof, the porous material having a k-value lower than 2.5, preferably lower than 2.3.

In an embodiment, the k-value exists at the level of the trenches.

The invention will now be described by a detailed description of several embodiments of the invention. It is clear that other embodiments of the invention can be configured according to the knowledge of persons skilled in the art without departing from the technical teaching of the invention, the invention being limited only by the terms of the appended claims.

Referring to FIG. 1:

FIG. 1 illustrates an embodiment where the pores of a porous substrate are filled and thereby sealed before treating (here etching) the surface of the porous substrate.

In step (Ia), a multilayer is provided comprising a porous low-k material 3. A hard mask 2 is provided on the porous low-k material 3 and a resist layer 1 is provided on the hard mask 2 by standard lithographic techniques. The hard mask 2 can for instance be made of TaN, TiN, SiN or amorphous carbon.

In step (Ib), an opening is performed in the resist layer 1 by a standard lithographic technique (for instance involving fluorocarbons), thereby making accessible a surface of the hard mask 2.

In step (Ic) the opened multilayer is transferred to a chamber at a reduced pressure P1 and at a temperature T1, wherein P1 is lower than P0 but higher than Pc at T1 for a selected organic gas 11g. The hard mask 2 is then etched by fluorine containing plasma, thereby making accessible a surface 5 of the porous material 3.

In step (II), the porous material 3 is contacted with the selected organic gas 11g, which penetrates the pores 12 (not depicted) of the porous material 3 and liquefies within, thereby providing an at least partly filled porous material. The temperature is then reduced to T2, i.e. below the freezing temperature of the organic liquid 11l at P1, thereby providing a protected porous material 4.

In step (III), the protected material 4 is then etched with a fluorine containing plasma 7 down to the appropriate depth. The etching creates waste 10 at the surface 5 of the protected material 4.

In step (IV), the plasma treatment 7 is then stopped, the temperature is allowed to increase to a temperature T3 sufficient to vaporize the organic solid (eventually via a transition to a liquid state). This temperature T3 can for instance be above T1 in such a way that P1 is below Pc at T3. The result of this exemplary embodiment is a patterned porous low-k material 3 which is not damaged and which is cleaned from at least some of its waste 10.

Figure 2:
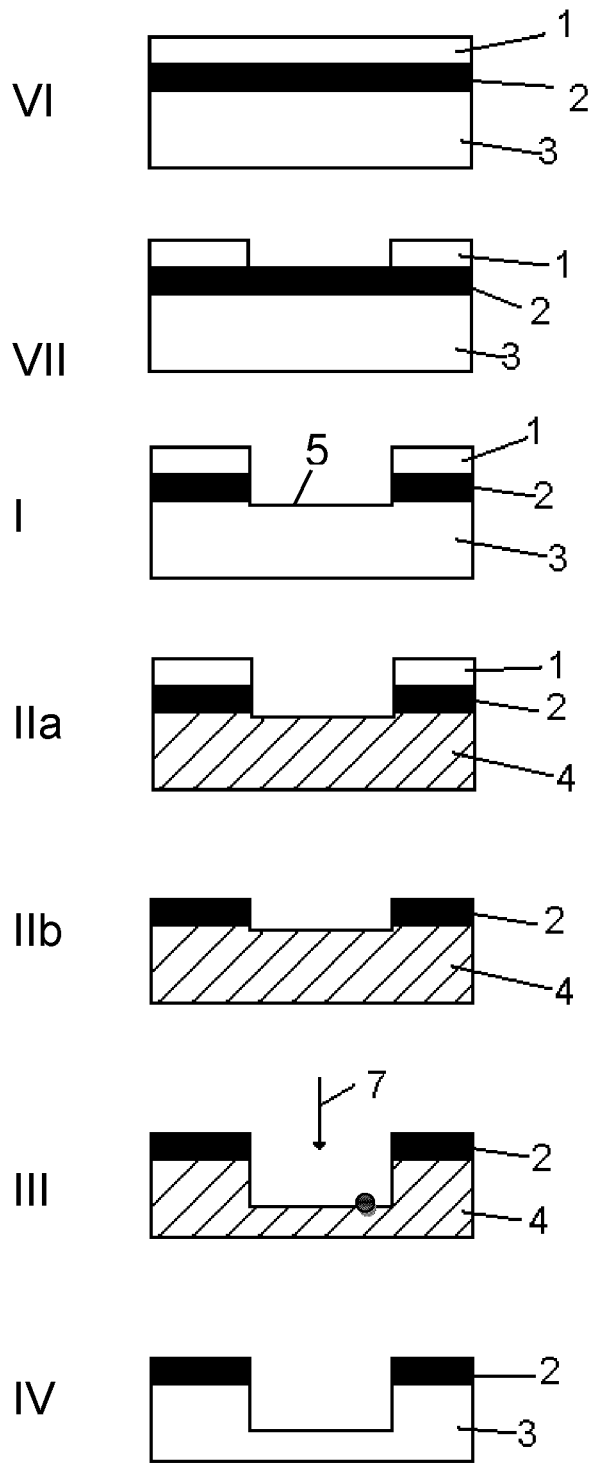
FIG. 2 is a diagrammatic illustration of a process according to another embodiment wherein the pores of a porous material are filled and sealed, but wherein the resist layer is stripped in situ after sealing the pores.

Referring to FIG. 2:

FIG. 2 illustrates an embodiment similar to FIG. 1 where the pores 12 (not depicted) of a porous material 3 are filled and sealed, thereby providing a protected material 4 before treating 7 (here removing the resist 1 and etching) the surface 5 of the protected material 4. However, in this embodiment, the resist layer 1 is stripped in situ during a step (IIb) after that the pores 12 of the material 3 have been sealed with the organic compound II. The stripping step uses oxygen or hydrogen plasma which is a source of damage for the porous material 3 and an indirect source of waste 10 due to the reaction with the material 3 during etching. Performing the stripping step after that the pores 12 of the material 3 have been sealed has therefore the advantage of avoiding damaging the porous material 3 during the resist 1 removal step.

Figure 3:
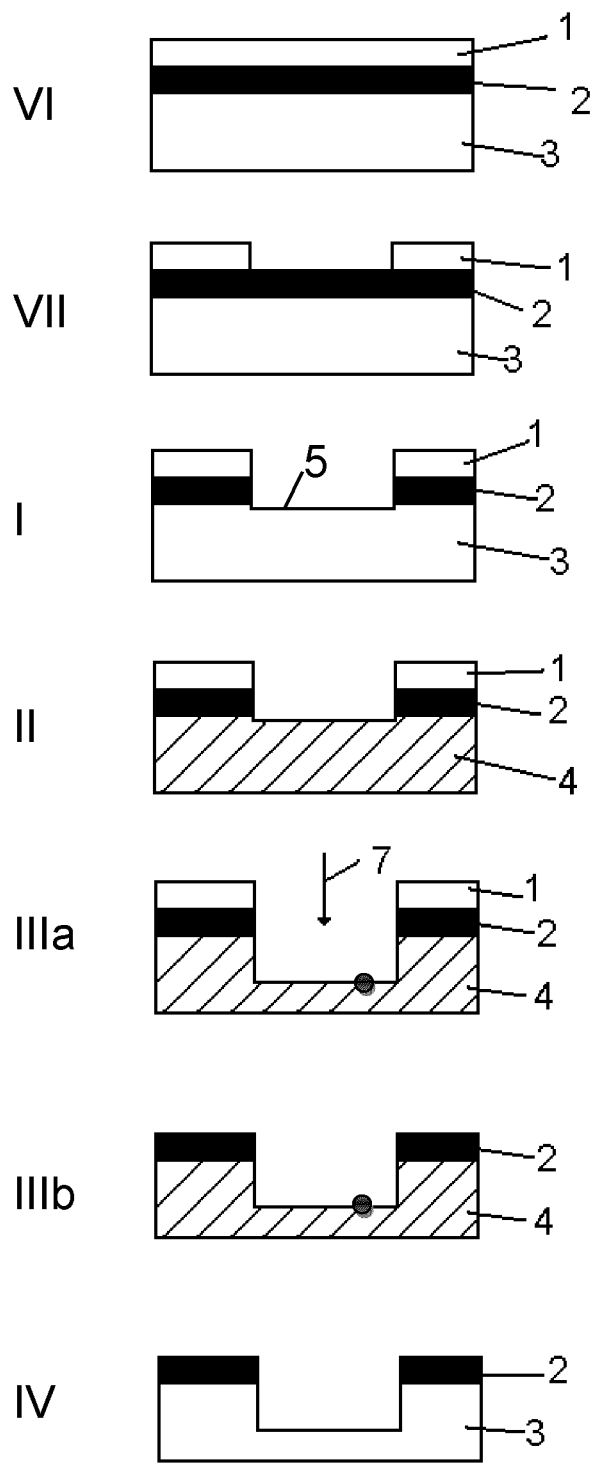
FIG. 3 is a diagrammatic illustration of a process according to yet another embodiment wherein the pores of a porous material are filled and sealed, but wherein the resist layer is stripped in situ after the pores have been filed and after the porous material has been etched.

Referring to FIG. 3:

FIG. 3 illustrates an embodiment similar to FIG. 2 where the pores 12 (not depicted) of a porous material 3 are filled and sealed before treating (here etching 7) the surface 5 of the protected porous material 4. However, in this embodiment, the resist layer 1 is stripped in situ during a step (IIIb) after that the pores 12 of the material 3 have been filled and after the protected porous material 4 has been etched with a fluorine containing plasma 7 down to the appropriate depth. The advantages are the same as for the embodiment of FIG. 2, i.e. avoiding damaging the porous material 3 during the resist 1 removal step.

Figure 4:
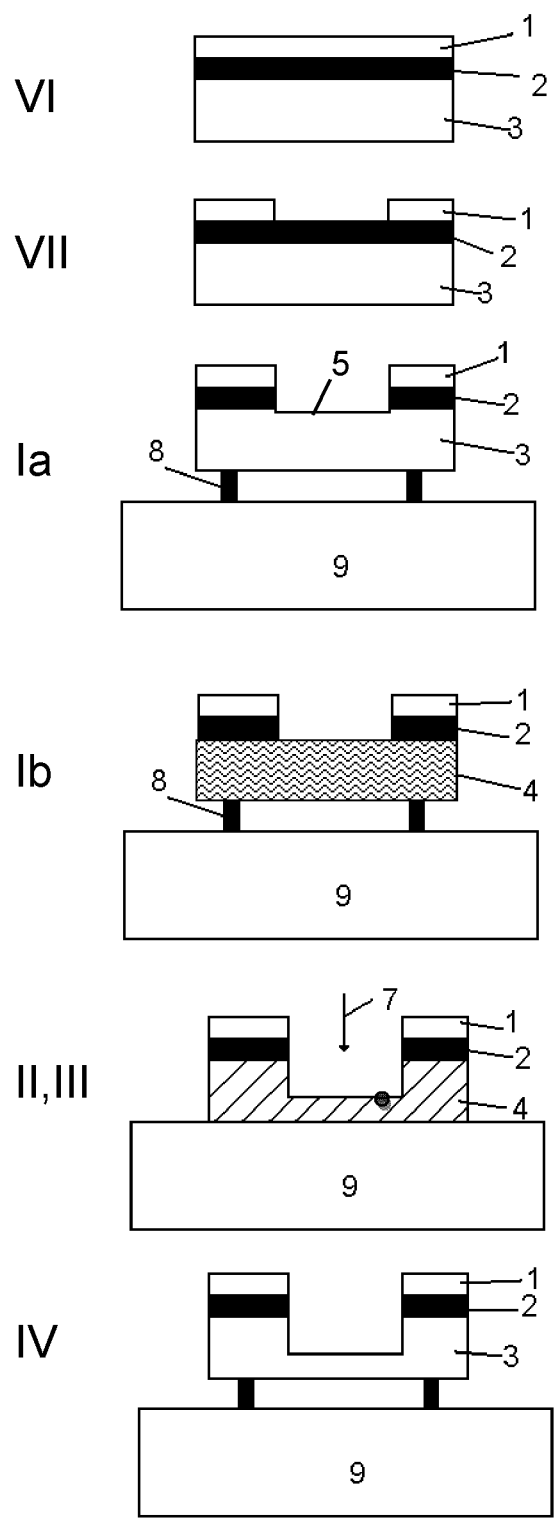
FIG. 4 is a diagrammatic illustration of a process according to yet another embodiment wherein a hard mask is provided on the porous material.

Referring to FIG. 4:

FIG. 4 shows a variant applicable to the embodiments of FIGS. 1-3. In FIG. 4, steps (Ia) and (Ib) are identical to the steps described in FIG. 1.

In step (Ia), a multilayer is provided comprising a porous low-k material 3. A hard mask 2 is provided on the porous low-k material 3 and a resist layer 1 is provided on the hard mask 2 by standard lithographic techniques. The hard mask 2 can for instance be made of TaN, TiN, SiN or amorphous carbon.

In step (Ib), an opening is performed in the resist layer 1 by a standard lithographic technique, thereby making accessible a surface 5 of the hard mask 2.

In step (Ic) the opened multilayer is transferred to a chamber at a reduced pressure P1 and at a temperature T1, wherein P1 is lower than P0 but higher than Pc at T1 for a selected organic compound II, and is positioned on retractable pins 8 of a bearing 9 (a chunk) having a temperature T2 below the freezing temperature of the organic compound II at P1. The hard mask 2 is then etched by fluorine containing plasma. Due to the presence of the pins 8, there is a certain distance between the material 3 and the cooled bearing 9, assuring that the temperature of the material 3 remains above T2 and above the temperature at with the liquid 11l freezes at P1.

In step (Id), the material 3 is contacted with the organic compound in the gas phase 11g, which penetrates pores 12 (not depicted) of the porous material 3 and liquefies within.

In step (II), the porous material 3 at least partly filled with the organic liquid 11l is lowered against the cooled bearing 9, thereby establishing thermal contact between the porous material 3 and the cooled bearing 9, thereby permitting the freezing of the liquid 11l within the pores 12 of the material 4. In step (III), the now protected material 4 is then etched with a fluorine containing plasma 7 down to the appropriate depth. The etching creates waste 10 at the surface 5 of the porous material 3.

In step (IV), the plasma treatment 7 is then stopped, the temperature is allowed to increase to a temperature T3 sufficient to vaporize the organic solid (eventually via a transition to a liquid state). This temperature T3 can for instance be above T1 in such a way that P1 is below Pc at T3. This raising of the temperature is made faster by lifting the protected material 4 away from the bearing 9. The result of this exemplary embodiment is a patterned porous low-k material 3 which is not damaged and is cleaned from at least some of its waste 10. An advantage of using the retractable pins 8, is that only the chunk needs to be at temperature T2 while the chamber can remain at T1.

Figure 5:
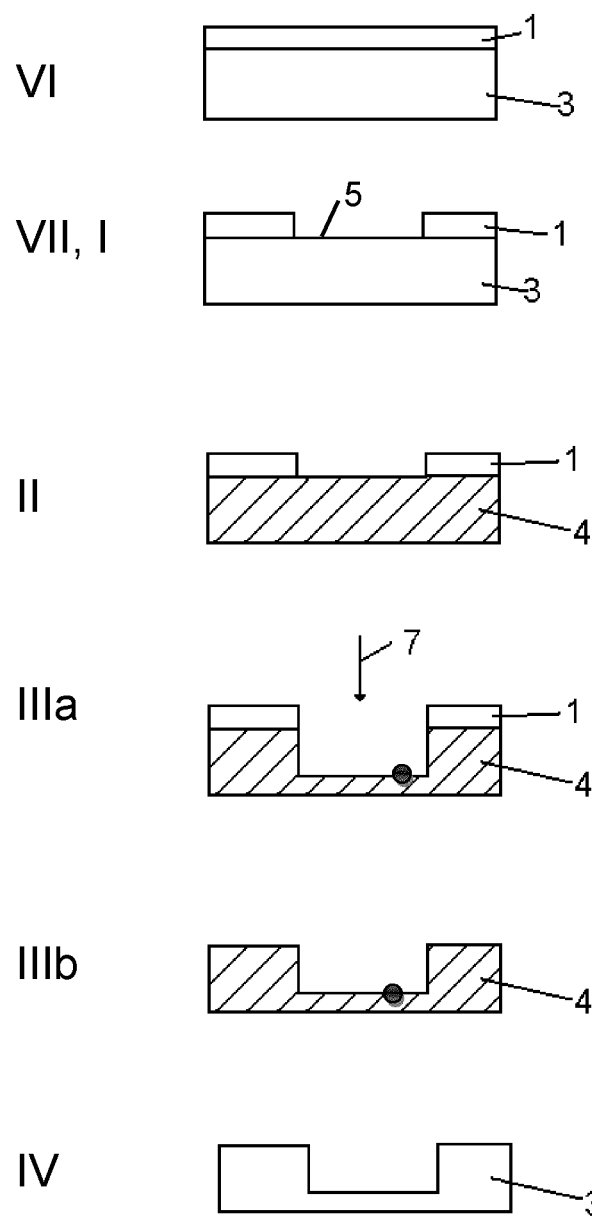
FIG. 5 is a diagrammatic illustration of a process according to yet another embodiment, similar to that depicted in FIG. 3 but wherein no hard mask layer is used.

Referring to FIG. 5:

FIG. 5 illustrates a particularly advantageous embodiment. It is similar to FIG. 3 where the pores 12 of a porous material 3 are filled and thereby sealed before treating 7 (here etching) the surface 5 of the protected porous material 4. However, in this embodiment, no hard mask layer 2 is used. A hard mask 2 is typically used to avoid low-k damage during the resist 1 strip in $O_2$ and $H_2$ plasma. In the embodiment of FIG. 5, no hard mask 2 is needed anymore because of ability to strip the resist 1 without damaging the low-k material 3. This is a big advantage because normally the hard mask 2 generates stress which is one of the reasons for line wiggling when working with small dimensions.

In step (Ia), a multilayer is provided comprising a porous low-k material 3. No hard mask 2 is provided on the porous low-k material 3 and a resist layer 1 is provided directly on the low-k material 3 by standard lithographic techniques.

In step (Ib), an opening is performed in the resist layer 1 by a standard lithographic technique (for instance involving fluorocarbons), thereby making accessible a surface 5 of the porous material 3.

In step (II) the opened multilayer is transferred to a chamber at a reduced pressure P1 and at a temperature T1, wherein P1 is lower than P0 but higher than Pc at T1 for a selected organic gas 11g, and the porous material 3 is contacted with the selected organic gas 11g, which penetrates the pores 12 (not depicted) of the porous material 3 and liquefies within, thereby providing a porous material 3 at least partly filled with the organic liquid 11l. The temperature is then reduced to T2, i.e. below the freezing temperature of the organic liquid 11l at P1.

In step (IIIa), the now protected substrate 4 is then etched with a fluorine containing plasma 7 down to the appropriate depth.

The resist layer is stripped in situ in $O_2$ and $H_2$ plasma during a step (IIIb). The advantages are the same as for the embodiment of FIG. 4, i.e. avoiding damaging the porous material 3 during the resist 1 removal step and this advantage is achieved without the use of a hard mask 2. The etching creates waste 10 at the surface of the protected material 4.

In step (IV), the plasma treatment 7 is then stopped, the temperature is allowed to increase to a temperature T3 sufficient to vaporize the organic solid (typically via a transition to a liquid state). This temperature T3 can for instance be above T1 in such a way that P1 is below Pc at T3. The result of this exemplary embodiment is a patterned porous low-k material 3 which is not damaged and which is cleaned from at least some of its waste 10.

In the embodiments of FIGS. 1-5, the organic compound 11 is always chosen in such a way that it has a cleaning effect on the wastes 10 generated by the treatment 7. These are however only preferred embodiments. Embodiments where the organic compound 11 has little or no cleaning effect (but for instance otherwise identical to the embodiments of FIGS. 1-5) are equally parts of the embodiments.

Figure 6:
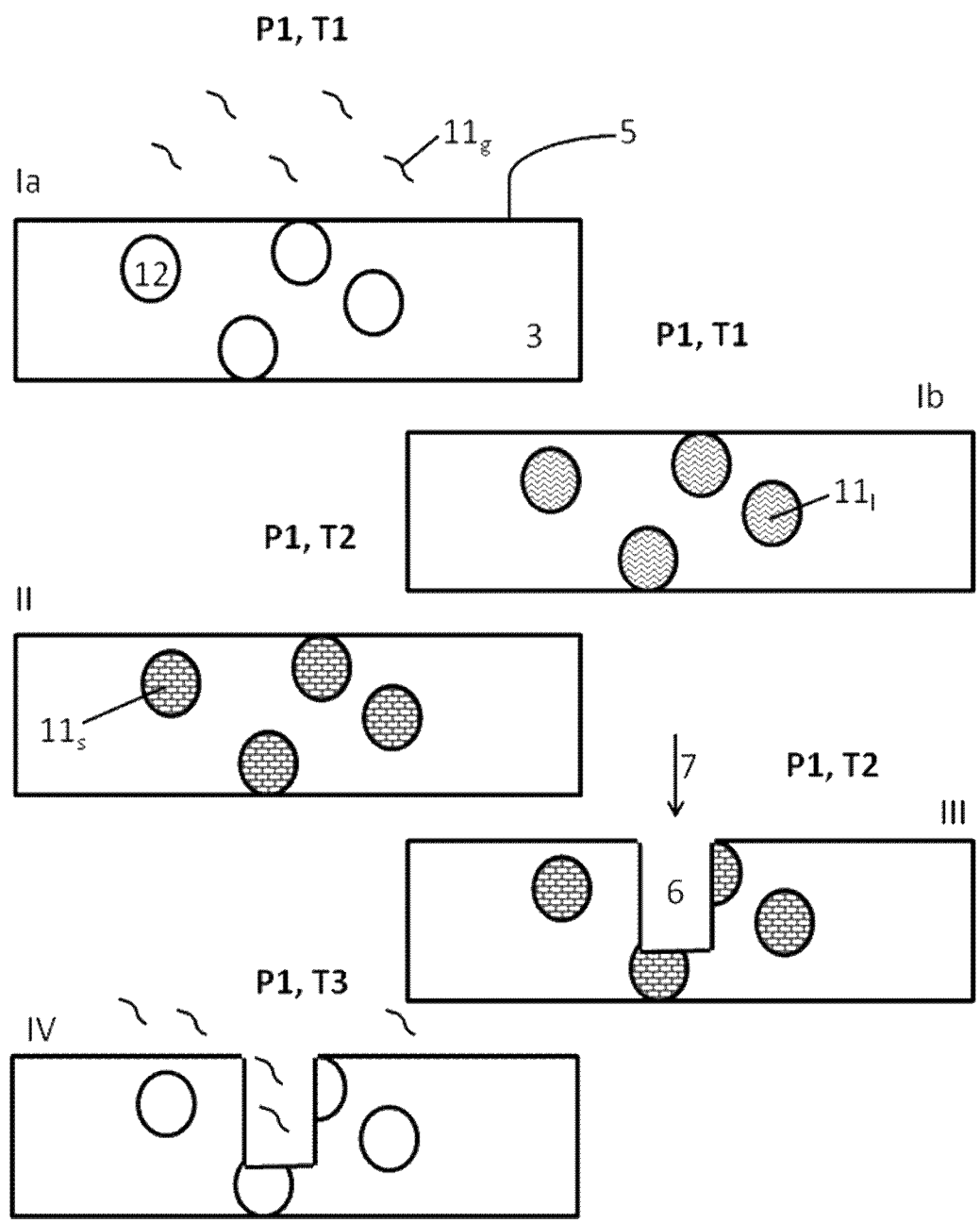
FIG. 6 is a diagrammatic illustration of a process according to yet another embodiment wherein the pores of a porous substrate are filled and thereby sealed before treating (etching) the surface of the porous substrate.

Referring to FIG. 6:

FIG. 6 illustrates an embodiment where the pores 12 of a porous substrate 3 are filled and thereby sealed before treating 7 (here etching) the surface 5 of the porous substrate 3.

In step (Ia), a porous low-k material 3 having a surface 5 is provided in an environment having a pressure P1 and a temperature T1. An organic gas 11g is provided in the environment. The organic gas 11g is such that at the pressure P1 and at the temperature T1 it remains a gas when outside of the porous material 3 but condenses as an organic liquid 11l when in contact with the porous material 3.

In step (Ib) shows the result of the contacting between the porous material 3 and the organic gas 11g. The organic gas 11g condensed within the pores 12 of the porous material 3 and filled the pores 12 with a liquid 11l.

In step (II), the pressure is maintained at P1 but the temperature is reduced to T2, i.e. below the freezing temperature of the organic liquid 11l at P1.

In step (III), the protected porous material 4 is then etched with a fluorine containing plasma 7 down to the appropriate depth. The etching creates a trench 6.

In step (IV), the plasma treatment 7 is then stopped, the temperature is allowed to increase to a temperature T3 sufficient to vaporize the organic solid (typically via a transition to a liquid state). This temperature T3 can for instance be above T1 in such a way that P1 is below Pc at T3. The result of this exemplary embodiment is a patterned porous low-k material 3 which is not damaged.

Figure 7:
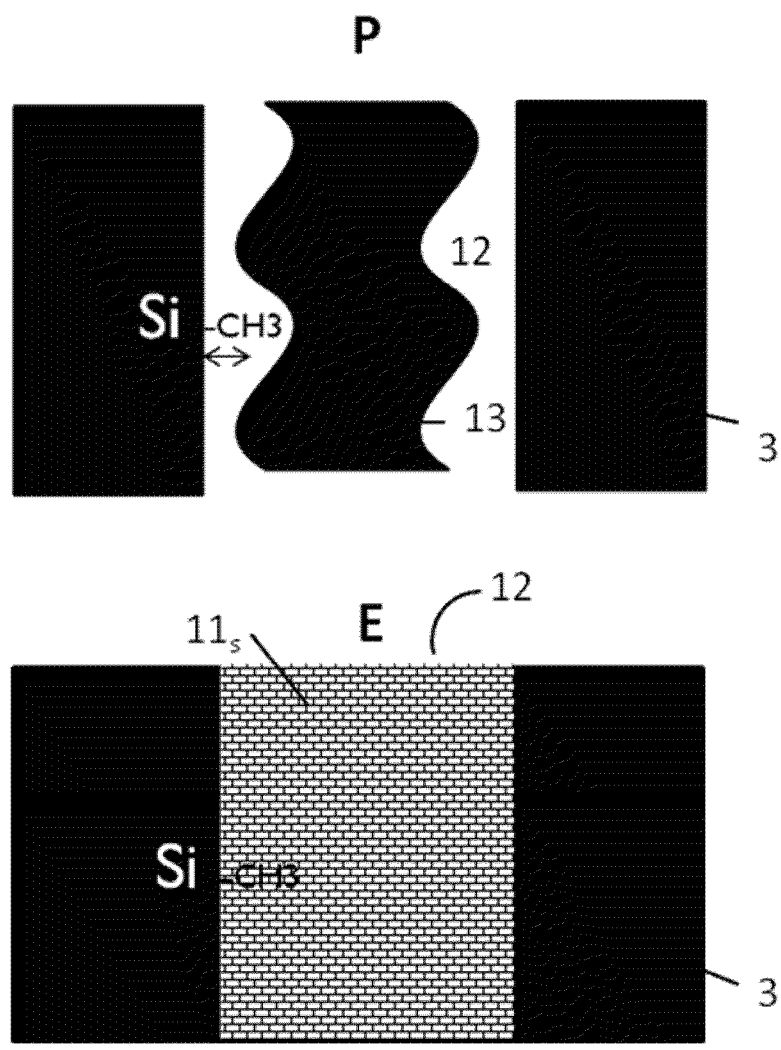
FIG. 7 is a diagrammatic illustration comparing a method of the prior art (P) with that of an embodiment (E).

FIG. 7 (P) schematically shows an embodiment of the prior art. It depicts an enlarged portion of a porous material 3 comprising a pore 12. The material 3 is shown to comprise Si atoms and $CH_3$ groups. One such $CH_3$ group is depicted within the pore 12 and bound to a Si atom of the material 3. Polymer 13 is depicted within the pore 12. It is visible that the pore 12 is not completely filled by the polymer 13, allowing for instanced the $CH_3$ group to detach (double arrow) during a subsequent treatment, leading to an alteration of the structure of the original porous material 3.

FIG. 7 (E) schematically shows an embodiment. It depicts an enlarged portion of a porous material 3 comprising a pore 12. The material 3 is shown to comprise Si atoms and $CH_3$ groups. One such $CH_3$ group is depicted within the pore 12 and bound to a Si atom of the material 3. An organic solid 11s is depicted within the pore 12. It is visible that the pore 12 is completely filled by the organic solid 13s, preventing for instanced the $CH_3$ group to detach during a subsequent treatment, leading to preservation of the structure of the original porous material 3.

It is to be understood that although preferred embodiments, specific constructions and configurations, as well as materials, have been discussed herein for devices according to the present invention, various changes or modifications in form and detail may be made without departing from the scope of this invention. For example, any formulas given above are merely representative of procedures that may be used. Functionality may be added or deleted from the block diagrams and operations may be interchanged among functional blocks. Steps may be added or deleted to methods described within the scope of the present invention.

What is claimed is:

1. A method for treating a surface of a porous material in an environment, the method comprising:
   I. contacting a porous material with an organic gas in an environment having a pressure P1 and a temperature T1, wherein the organic gas is such that at the pressure P1 and at the temperature T1 it remains a gas when outside of the porous material but condenses as an organic liquid when in contact with the porous material, thereby filling pores of the porous material with the organic liquid, thereafter
   II. cooling down the porous material to a temperature T2 such that the organic liquid freezes within the pores, thereby sealing the pores with an organic solid, thereby providing a protected porous material, and thereafter
   III. performing a treatment on a surface of the protected porous material.

2. The method of claim 1, further comprising, after step III:
IV. removing the organic solid from the porous material.

3. The method of claim 2, wherein the removing comprises contacting the organic solid with an auxiliary liquid miscible with the organic liquid.

4. The method of claim 2, wherein the removing comprises raising the temperature of the protected porous material to a temperature T3 so as to vaporize the organic solid.

5. The method of claim 1, wherein the pressure P1 is lower than an equilibrium vapor pressure P0 of the organic gas at temperature T1 but equal to or higher than a critical pressure Pc at temperature T1, wherein the critical pressure Pc is a pressure at which a liquid phase and a vapor phase of the organic gas are at equilibrium within the porous material.

6. The method of claim 1, wherein the temperature of the porous material is equal to T1 at the time of the performance of step I.

7. The method of claim 1, wherein the treatment is an etching.

8. The method of claim 7, wherein the etching is etching to form a recess, wherein the method further comprises, after step III and before or after step IV:
V. filling at least partially the recess with a metal.

9. The method of claim 1, wherein the treatment is a plasma treatment.

10. The method of claim 1, wherein the plasma treatment is a plasma etching.

11. The method of claim 1, wherein step II is delayed until the porous material and the organic liquid are at equilibrium.

12. The method of claim 1, wherein the porous material is a nanoporous material.

13. The method of claim 1, wherein the porous material is a silicon-containing porous material.

14. The method of claim 4, wherein T3 is lower or equal to 250° C.

15. The method of claim 4, wherein T3 is from 10 to 40° C.

16. The method of claim 1, wherein T2 is higher than −130° C.

17. The method of claim 1, wherein T2 is from −50° C. to −10° C.

18. The method of claim 1, further comprising, before step I:
VI. providing a porous material having a surface bearing a resist layer; and
VII. patterning the resist layer so as to expose a surface of the porous material, thereby providing the surface of the porous material,
wherein the treatment of the surface is an etching of the surface, thereby forming a recess in the protected porous material.

* * * * *